United States Patent [19]

Su

[11] Patent Number: 5,552,124
[45] Date of Patent: Sep. 3, 1996

[54] STATIONARY FOCUS RING FOR PLASMA REACTOR

[75] Inventor: Yin-Jia Su, Cupertino, Calif.

[73] Assignee: Applied Materials, Inc., Santa Clara, Calif.

[21] Appl. No.: 263,847

[22] Filed: Jun. 22, 1994

[51] Int. Cl.⁶ .................................................. C23C 16/02
[52] U.S. Cl. .................... 156/345; 156/345; 204/192.1; 204/298.31; 422/186.05; 118/723 FI
[58] Field of Search .............................. 422/186.05, 906; 156/643, 646, 345; 204/192.1, 298.31

[56] References Cited

U.S. PATENT DOCUMENTS

| | | | |
|---|---|---|---|
| 4,612,432 | 9/1986 | Sharp-Geisler | 219/121 |
| 5,213,658 | 5/1993 | Ishida | 156/643 |
| 5,246,532 | 9/1993 | Ishida | 156/345 |
| 5,384,009 | 1/1995 | Mak et al. | 156/662 |
| 5,405,491 | 4/1995 | Shahvandi et al. | 156/643 |

OTHER PUBLICATIONS

U.S. Patent Application Serial No. 08/223,335, filed Apr. 5, 1994, entitled Improved Focus Ring for Semiconductor Wafer Processing in a Plasma Reactor.

*Primary Examiner*—Donald P. Walsh
*Assistant Examiner*—Daniel Jenkins
*Attorney, Agent, or Firm*—Michael A. Glenn

[57] ABSTRACT

A stationary focus ring for use in a plasma reactor during wafer processing includes a first slotted opening through which a wafer transfer blade and wafer may pass, and includes a second slotted opening, where the two openings cooperate to provide a balanced gas flow distribution across the wafer surface, such that process uniformity is achieved across the wafer surface, while minimizing the actual size of the openings to provide an increased level of reaction commensurate with that of a solid, movable focus ring. Alternatively, a thick focus ring that displaces chamber volume and thereby stabilizes gas flow within the chamber has a circular, an eccentric, and/or a baffle configuration to provide uniform gas flow distribution across the wafer surface.

19 Claims, 9 Drawing Sheets

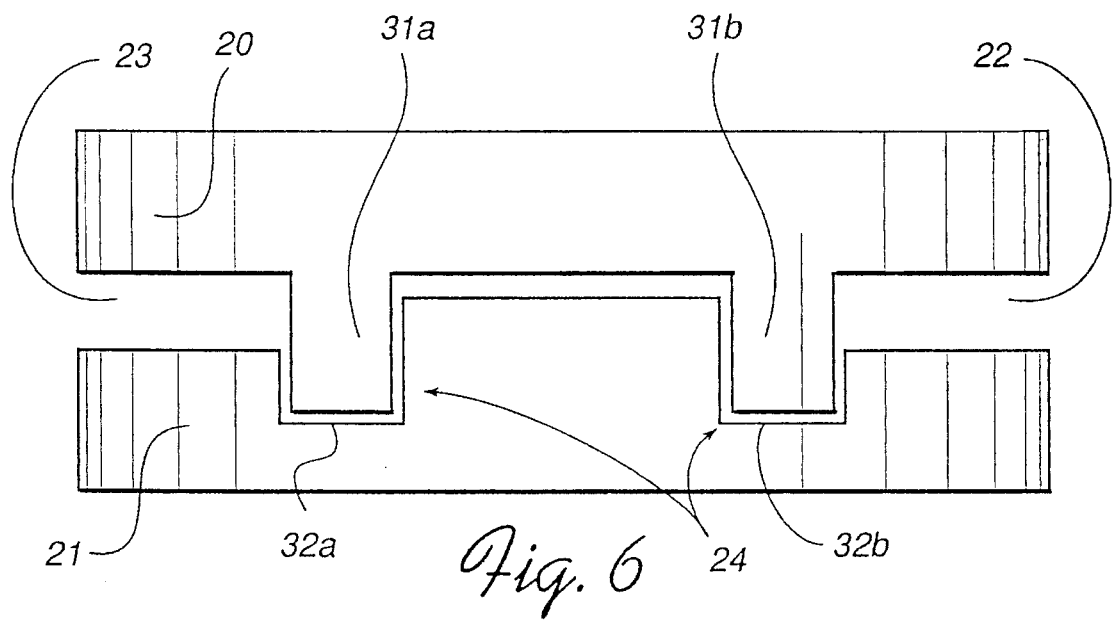
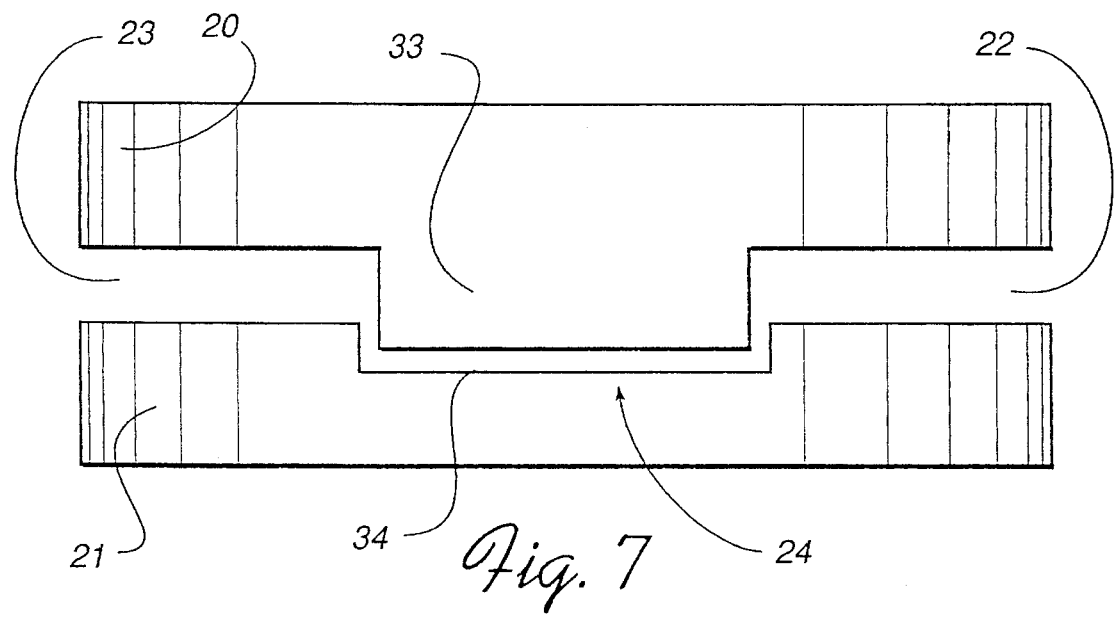

5,552,124

STATIONARY FOCUS RING FOR PLASMA REACTOR

BACKGROUND OF THE INVENTION

1. Technical Field

The present invention relates to plasma reactors, for example as are used to process semiconductor wafers during wafer etching. More particularly, the present invention relates to an improved stationary focus ring for a plasma reactor.

2. Description of the Prior Art

Semiconductor wafer processing steps, such as etching or chemical vapor deposition, are often carried out using a plasma reactor in which a focus ring is placed around the wafer to reduce wafer etch non-uniformity that results from non-uniform plasma distribution across the wafer surface. It is thought that such plasma non-uniformity is caused by non-uniform process gas distribution across the wafer surface, as well as other factors, such as non-uniform cathode temperature distribution and non-uniform electrical and magnetic field distribution across the wafer.

Typically, a process gas is introduced into the chamber at the top of the chamber, and a vacuum exhaust system having an intake positioned at the bottom of the chamber draws the process gas through the chamber to maintain a desired chamber pressure. The wafer is usually supported on a pedestal placed in the center of the chamber. Process gas distribution across the wafer surface is influenced by the position of the intake of the vacuum exhaust system such that there is a higher gas flow rate at the edge of the wafer than at the wafer center. Thus, during wafer etch a higher plasma density near the wafer edges produces a significantly higher etch rate at the wafer edge than at the wafer center, thereby degrading process uniformity. A similar lack of uniformity is observed in a chemical vapor deposition ("CVD") reactor.

FIG. 1 is a partially sectioned schematic view of a prior art reaction chamber 2 having chamber walls 4 and a slit valve 6 that allows wafer ingress to and egress from the chamber. The wafer 10 is supported by a wafer pedestal 12 which is positioned over a cathode base 13. The wafer 10 is shielded by a focus ring 14 that rests on the pedestal 12 and that surrounds the wafer.

A downward process gas flow produced by a vacuum pump 8 is shown by the arrows identified by numeric designator 11. During wafer processing, the focus ring provides a partial barrier to process gas flow, such that a slight back pressure is built-up across the wafer surface, causing more process gas to flow across the wafer center. As a result a more uniform gas flow is provided across the wafer surface, thereby improving process uniformity and efficiency.

The focus ring 14 extends above the wafer surface by a few centimeters and is supported by a lift mechanism 15 that lifts the focus ring a sufficient amount to allow the wafer to be transferred between a load lock and the chamber. The lift mechanism has several moving parts, including a lift cylinder 15a that surrounds the cathode base 13, a lift spider 15b that is positioned within the cathode base, and lift pins 15c that are supported on the lift spider and that extend through vertical bores 17 that are formed in the pedestal 12.

The cathode base 13 includes voids 18 that permit vertical movement of the lift spider 15b within the cathode base. A window 15d, formed through the lift cylinder 15a permits the wafer 10 to be transported through the slit valve 6, to and from the wafer pedestal, whenever the lift cylinder is raised sufficiently to align the window with the slit valve. Whenever the lift cylinder is so raised, the lift pins 15c extend through the bores to lift the wafer above the pedestal and permit a wafer transfer blade (not shown) to slide beneath the wafer.

Although the focus ring effectively improves wafer process rate uniformity across the wafer by improving gas flow distribution across the wafer surface, the focus ring tends to trap particulate contamination 16 near the wafer edges. Such contaminants reduce die yield in that portion of the wafer near the wafer edges. Particulate contamination may also be trapped by moving parts within the chamber, for example such as comprise the lift mechanism 15. When the lift mechanism is operated, resulting vibration tends to loosen and circulate contaminating particles, thereby increasing the likelihood that such particles are deposited on the wafer surface. It is therefore desirable to reduce the complexity of the focus ring by eliminating the number of parts associated therewith, for example by producing a stationary focus ring.

It is also desirable to eliminate the build-up of particulate contamination near the wafer edges, such as is attributable to the focus ring, without surrendering any of the advantages of the focus ring. One approach to reducing particle build-up at the wafer edges is to form at least one opening in the focus ring that allows the process gas to sweep the contaminating particles from the wafer surface, through the opening and downward into the vacuum pump exhaust. Such approach is described in G. Hills, Y. J. Su, Y. Tanase, R. Ryan, Improved *Focus Ring For Semiconductor Wafer Processing In A Plasma Reactor,* U.S. patent application Ser. No. 08/223, 335, filed Apr. 5, 1994, and commonly assigned to Applied Materials, Inc.

While the stationary focus ring described by Hills et al is meritorious, there is still a need to reduce further the effects of wafer contamination, while at the same time maintaining or improving a high degree of process uniformity across the wafer surface.

SUMMARY OF THE INVENTION

The present invention provides an improved focus ring for a plasma reactor. In the preferred embodiment of the invention, a slotted focus ring includes a first opening through which a wafer transfer blade and wafer may pass; and includes a second opening. The two openings cooperate to provide a balanced gas flow distribution across the wafer surface, such that process uniformity is achieved across the wafer surface, while minimizing the actual size of the openings to provide an increased level of reaction commensurate with that of a solid, movable focus ring; and while permitting contaminating particles to be swept from the wafer edges.

The focus ring may be a unitary structure, or a compound structure, where the focus ring has different opening sizes adapted for different processes; and such that the various portions of the ring may be formed of different materials to optimize each portion of the ring for its specific function, e.g. by using a process tolerant material for that portion of the focus ring proximate to the wafer and a durable, less expensive material for that portion of the focus ring distant from the wafer.

The invention also provides a thick focus ring that is adapted to displace chamber volume and thereby stabilize gas flow within the chamber. The thick focus ring may have an eccentric configuration to profile the gas flow pattern within the chamber to provide uniform gas flow distribution across the wafer surface.

Additionally, the focus ring may extend to the chamber walls, such that the ring, in conjunction with various slots and/or apertures formed through the focus ring, operates as a baffle to establish a uniform gas flow through the chamber and thereby provide uniform gas flow across the wafer surface.

BRIEF DESCRIPTION OF THE DRAWINGS

FIG. 6 is a side view a two piece stationary focus ring according to one preferred embodiment of the present invention;

FIG. 7 is a side view a two piece stationary focus ring according to another preferred embodiment of the present invention;

DETAILED DESCRIPTION OF THE INVENTION

The present invention provides an improved focus ring for use to shield a wafer during wafer processing in a plasma reactor. In one preferred embodiment of the invention, a slotted focus ring includes a first opening through which a wafer transfer blade and wafer may pass; and includes a second opening adapted to allow gas flow therethrough at a rate symmetrical to that through the first opening, such that gas flow distribution across the wafer surface is uniform. Thus, the two openings cooperate to provide a balanced gas flow distribution across the wafer surface, such that process uniformity is achieved across the wafer surface, while minimizing the actual size of the openings to provide an increased level of reaction commensurate with that of a solid, movable focus ring. The invention may provide a focus ring having a single slotted opening, in addition to providing two or more openings. Such opening need not be slotted, but rather may be apertured, journaled, etc. Additionally the openings (other than the wafer transfer blade/ wafer opening) may be formed through an upper surface of the focus ring, as well as, or instead of the rear portion of the focus ring.

Figure 1:
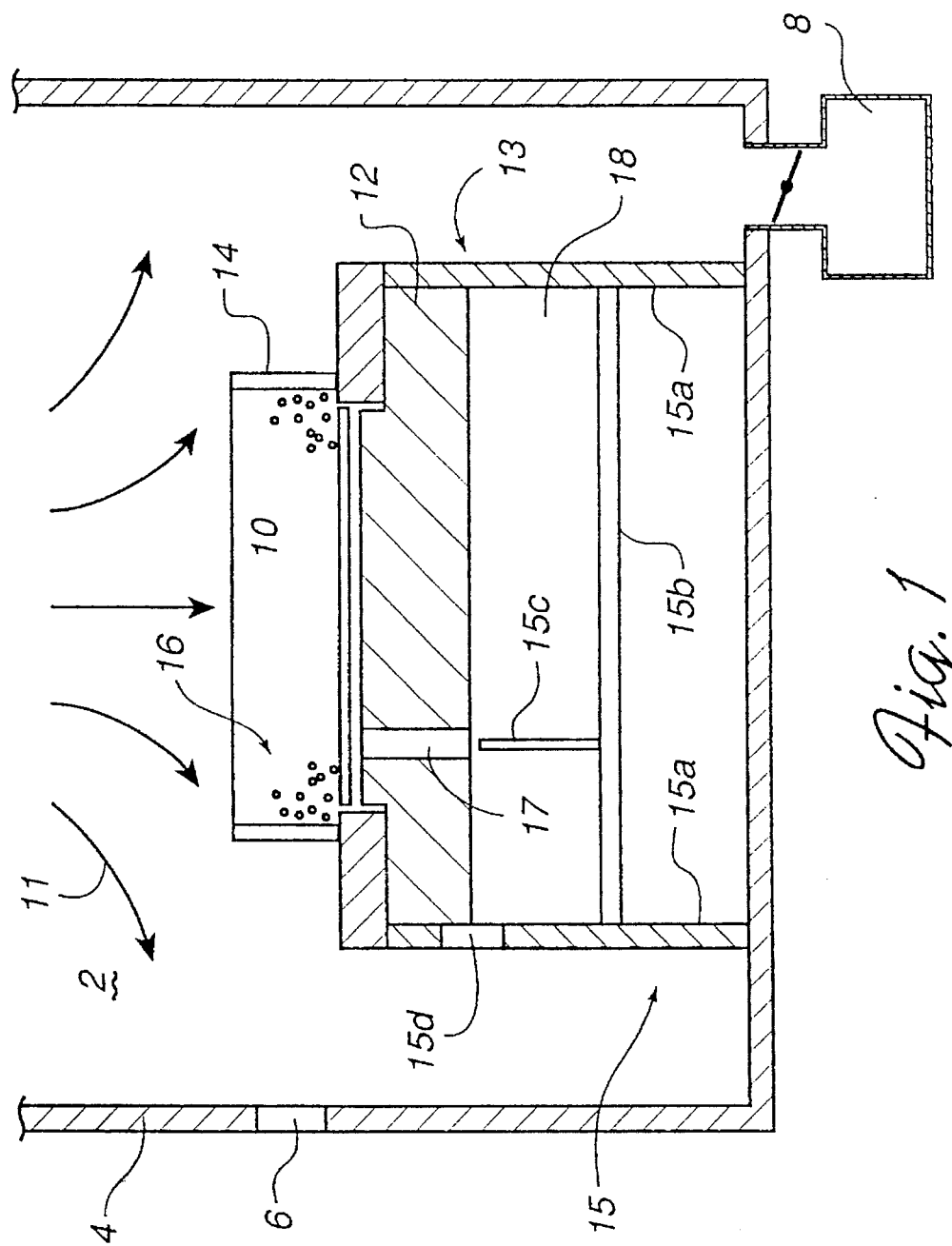
FIG. 1 is a partially sectioned schematic view of a prior art reaction chamber.
Figure 2:
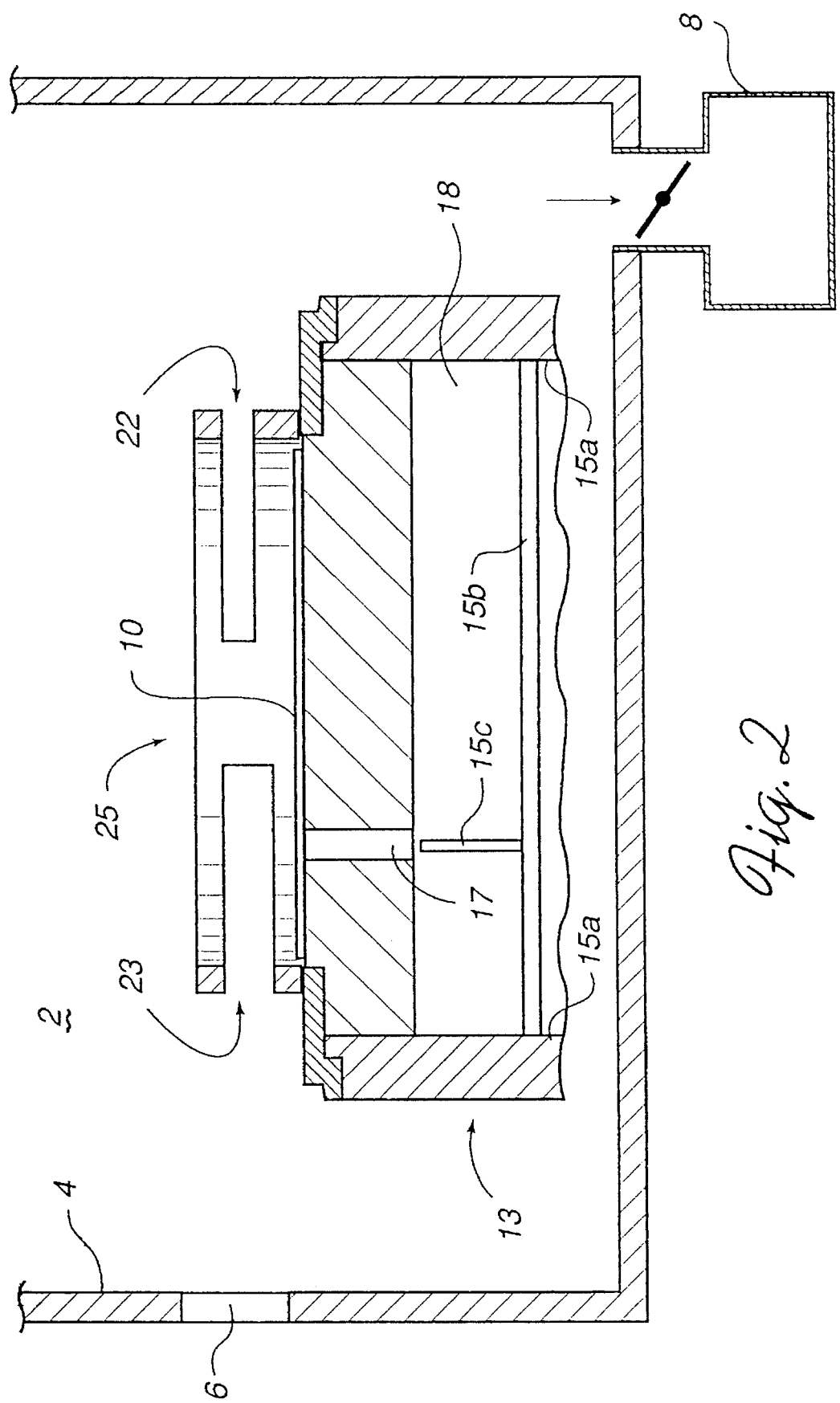
FIG. 2 is a partially sectioned schematic view of a reaction chamber, including a slotted stationary focus ring according to the present invention.

FIG. 2 is a partially sectioned schematic view of a reaction chamber, including a slotted stationary focus ring according to the present invention. Those elements of the reaction chamber that are common with the prior art reaction chamber shown in FIG. 1 have the same numeric designation. In the figure, a reaction chamber 2 is shown having chamber walls 4 and a slit valve 6 that allows wafer ingress to and egress from the chamber. The wafer 10 is supported by a wafer pedestal 12 which is positioned over a cathode base 13. The wafer 10 is shielded by a focus ring 25 that rests on the pedestal 12 and that surrounds the wafer.

A wafer lift mechanism includes a lift cylinder 15a that surrounds the cathode base 13, a lift spider 15b that is positioned within the cathode base, and lift pins 15c that are supported on the lift spider and that extend through vertical bores 17 that are formed in the pedestal 12. The cathode base 13 includes voids 18 that permit vertical movement of the lift spider 15b within the cathode base. Whenever the lift cylinder is raised, the lift pins 15c extend through the bores to lift the wafer above the pedestal to permit a wafer transfer blade (not shown) to slide beneath the wafer.

During wafer processing, the focus ring provides a partial barrier to process gas flow, such that a slight back pressure is built-up across the wafer surface, causing more process gas to flow across the wafer center. As a result a more uniform plasma is provided across the wafer surface, thereby improving process uniformity. In particular, the focus ring is configured to have the smallest possible slotted openings consistent with wafer ingress/egress and symmetric gas flow distribution across the wafer surface.

The focus ring itself is stationary, i.e. it is not lifted into position to align a window formed in the cylinder or focus ring with the slit valve during wafer loading and unloading. Rather, the focus ring includes a slot 23 that is aligned with the slit valve 6. As a result, the focus ring does not require a complicated lift mechanism. This arrangement reduces the cost of manufacturing and maintaining the chamber. More significantly, by eliminating moving parts, the focus ring herein described reduces excessive vibration that can dislodge and circulate contaminating particles, which are likely to be otherwise deposited on the wafer surface. Eliminating moving parts also eliminates the number of surfaces that can collect contaminating particles.

The focus ring includes two slots 22 and 23 that provide openings through which process gas may flow during wafer processing. One slot 23 is configured to accept a wafer transfer blade and wafer during wafer loading and unloading; the other slot 22 is configured to allow a flow of process gas across the wafer that compensates for a process gas flow through the wafer loading/unloading slot 23. Significantly, the focus ring described herein includes openings in the form of a one or more slots, such that a back pressure is maintained across the wafer surface by the focus ring that prevents excessive flow of plasma away from the wafer surface. Thus, the invention provides a stationary ring in which only a minimal opening is provided in the area about the edges of the wafer. The slots preferably have an opening that commences above the surface of the wafer, such that the slots formed in the focus ring define a lower edge that provides a process gas barrier about the edges of the wafer. In this way, wafer contamination is reduced, process uniformity is maintained, and process efficiency is enhanced.

Figure 3:
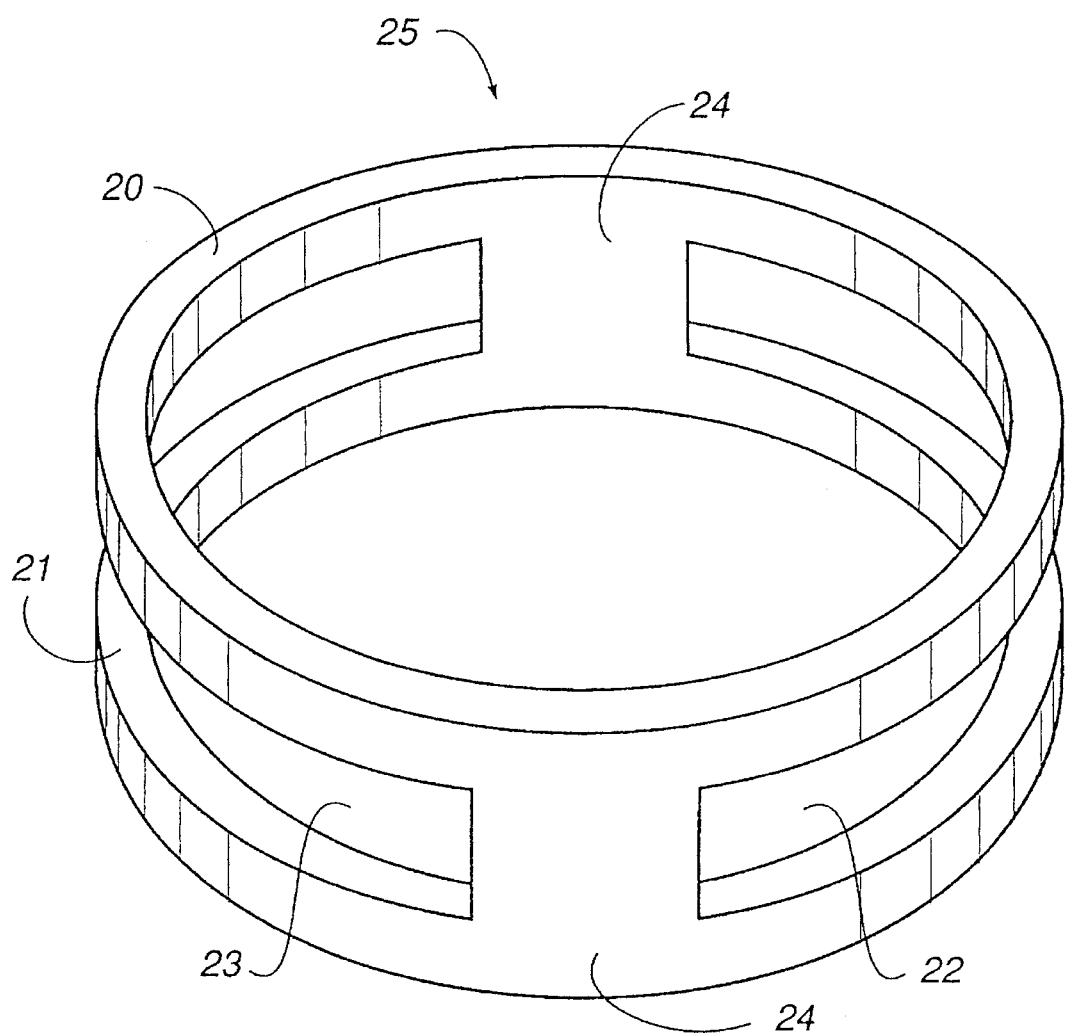
FIG. 3 is a perspective view of a slotted stationary focus ring according to a preferred embodiment of the present invention.

FIG. 3 is a perspective view of a slotted stationary focus ring according to a preferred embodiment of the present invention. In the figure, a unitary focus ring 25 includes an upper ring portion 20 and a lower ring portion 21. Each ring portion is joined by a pair of links 24, which also serve to define the slots 21 and 22. As discussed below, it is not necessary that the ring be a unitary structure, nor is it necessary that each slot have the same configuration. In the ring shown in FIG. 3, the slots each define an opening in the focus ring, and at least one of the slots must have a height and width that is sufficient to receive a wafer transfer blade and wafer. It should be appreciated that one aspect of the invention involves reducing the size of the openings in the focus ring to assure that a maximum amount of plasma is distributed across the wafer surface, such that processing proceeds in the most efficient manner possible. Another aspect of the invention is to provide such opening in a symmetric manner that evenly distributes the process gas across the wafer surface, such that said processing proceeds in the most uniform manner possible.

Figure 4:
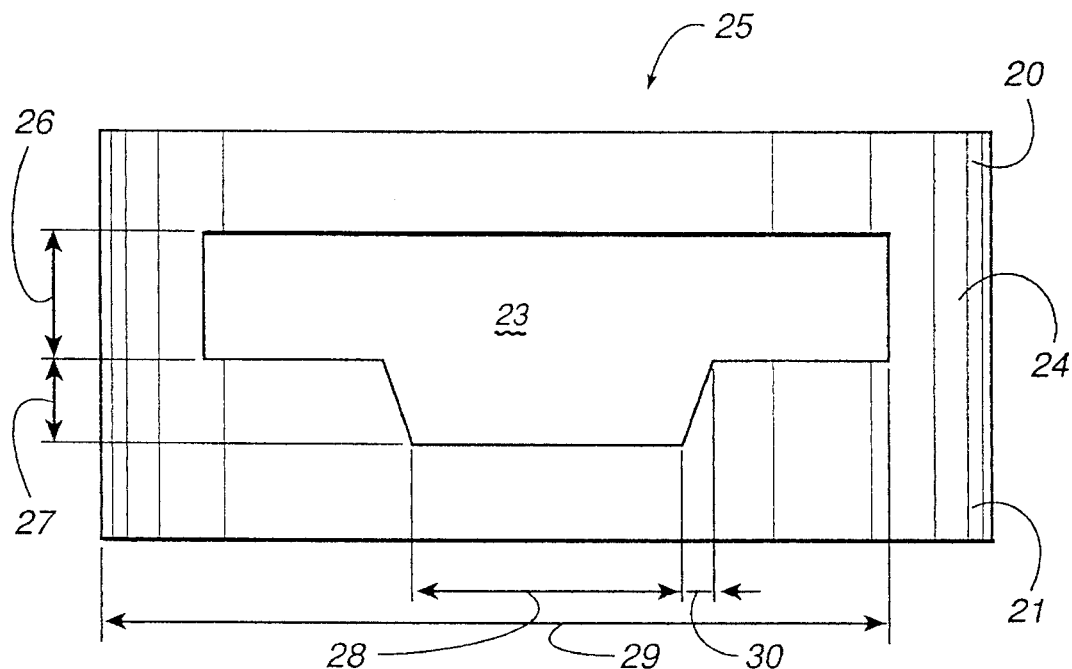
FIG. 4 is a side view of an improved stationary focus ring showing a front slot that is adapted to receive a wafer and a wafer transfer blade according to the present invention.

FIG. 4 is a side view of an improved stationary focus ring 25 showing a front slot 23 that is adapted to receive a wafer and a wafer transfer blade (not shown) according to the preferred embodiment of the present invention. In the figure, the slot 23 includes an upper portion having a height and width as shown by the arrows identified by numeric designators 26 and 29, respectively, that is sufficient to accommodate a wafer. For example, for a 15.24 cm (6-inch) wafer, the upper portion of the slot should be about 15.7 cm to 16.0 cm (6⅛ inches to 6⅓ inches). The slot also includes a lower portion having a height and width as shown by the arrows identified by numeric designators 27 and 28, respectively. The lower slot portion is also shown having a sloped portion that provides a transition from the bottom of the upper slot portion to the bottom of the lower slot portion and that is identified by the numeric designator 30. The lower slot portion should be of sufficient height and width to accommodate the wafer transfer blade that is used with the chamber and, if possible, should be profiled, for example with a slope or otherwise, to minimize the size of the slot opening. The lower edge of the upper portion of the slot is preferably situated above the wafer surface, such that a continuous process gas barrier is provided about the wafer edges. In the exemplary embodiment of the invention, the lower edge of the slot may be about 0.2 cm.

Figure 5:
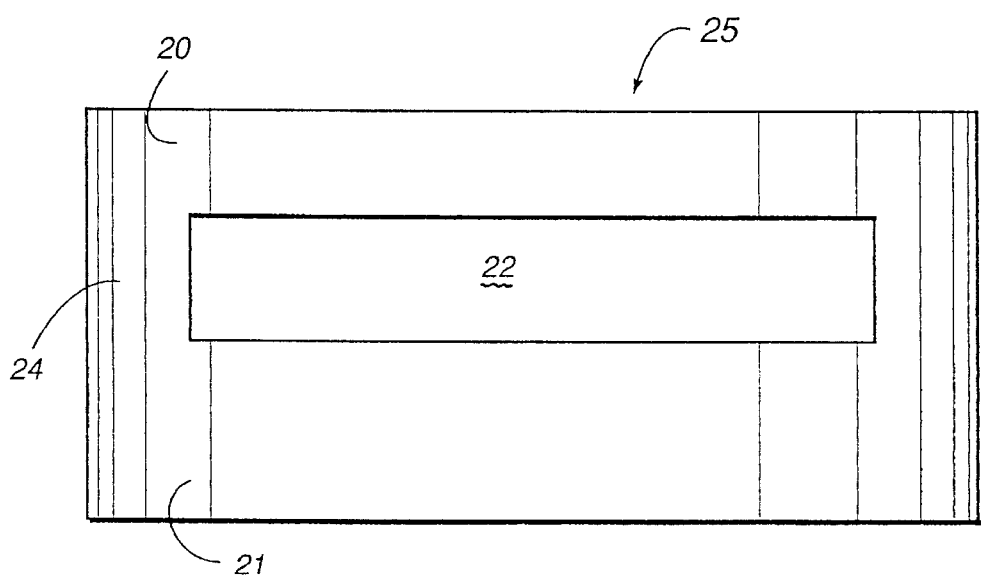
FIG. 5 is a side view of a slotted stationary focus ring showing a rear slot according to the present invention.

FIG. 5 is a side view of a slotted stationary focus ring 25 showing a rear slot 22 according to the preferred embodiment of the present invention. The height and width of the rear slot 22 are selected to balance gas distribution across the wafer surface. For example, for a 15.24 cm (6-inch) wafer, the upper portion of the slot should be about 15.7 cm to 16.0 cm (6⅛ inches to 6⅓ inches), although such dimensions are provided merely for purposes of example and other dimensions may be chosen depending upon the application to which the invention is put.

The rear slot is typically situated closer to the vacuum pump than the front slot. Accordingly, the rear slot need not be as large as the front slot and therefore need not be profiled in the same manner as the front slot. Rather, both slots should provide the minimum opening necessary to accommodate the wafer transfer blade and wafer (in the case of the front slot), and to provide uniform process gas distribution across the wafer surface (in the case of the rear slot). Furthermore, the rear slot need not be a slot, but may be a series of slots spaced about the perimeter of the focus ring, or it may be a series of apertures formed through the side or upper and lower surfaces of the focus ring that communicate with an exhaust plenum associated with the vacuum pump.

FIG. 6 is a side view of a two piece stationary focus ring 25 according to one preferred embodiment of the present invention. In the figure, a lower focus ring portion 21 is linked with an upper focus ring portion 20 by links 24 that comprise complementary tabs 31a/31b and slots 32a/32b. The tabs and slots are configured to provide a closed link that prevents an outflow of process gas, such that the slots 22 and 23 define the openings formed in the focus ring. However, the upper ring portion may be formed having different sized tabs to define larger or smaller openings, both in the slots 22 and 23 and in the link region. Thus, an inventory of upper focus rings portions may be maintained if desired, each ring portion having a specific configuration for a specific process step, such that gas flow distribution across a wafer surface is easily optimized for each process or process step by exchanging one upper portion of the focus ring with another such portion.

Additionally, each portion of a compound focus ring may be made of a different material. For example, the top portion of the focus ring may be made of an inexpensive, durable material, such as quartz, Kovar®, or ceramic materials; while the bottom portion, which is closer to the wafer and therefore more likely to be affected by, or to affect, processing conditions at the wafer surface, may be made of a less process sensitive material that would provide better process results, such as Vespell® (manufactured by DuPont).

It can be seen that a compound focus ring may be linked in any of a number of ways. For example, FIG. 7 is a side view a two piece stationary focus ring according to another preferred embodiment of the present invention. In the figure, the link 24 consists of a single elongated tab 33 and a complementary slot 34.

Figure 8:
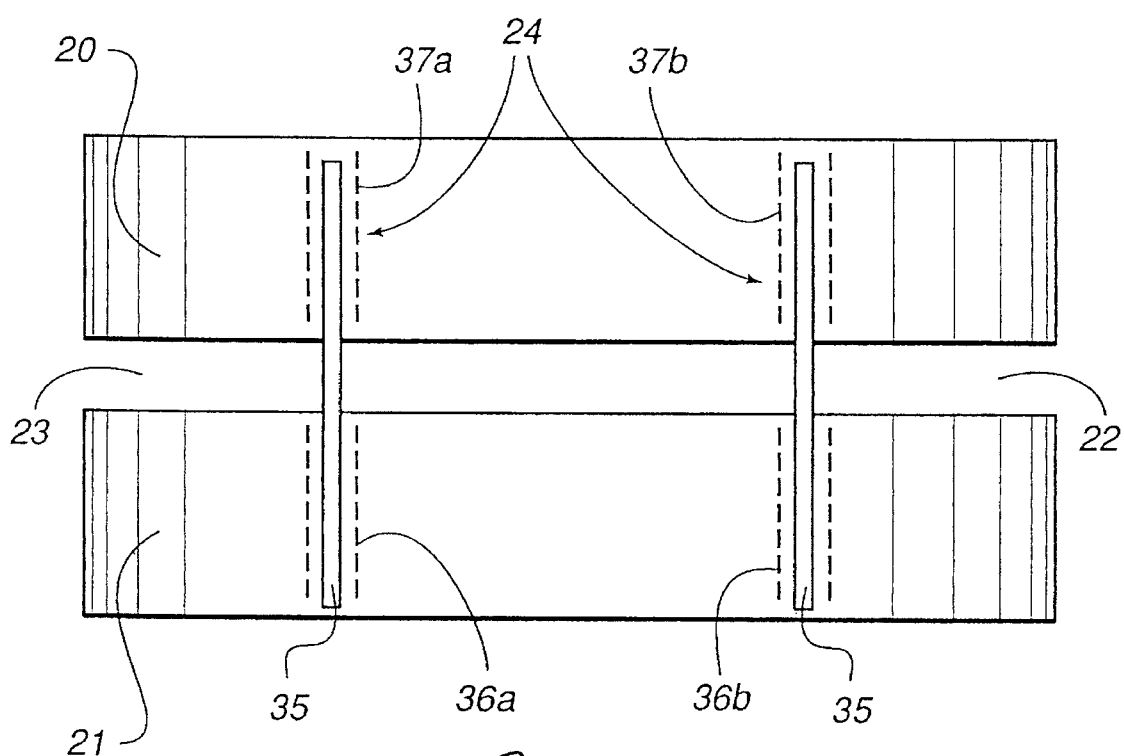
FIG. 8 is a side view a two piece stationary focus ring according to another preferred embodiment of the present invention.

FIG. 8 is a side view a two piece stationary focus ring according to another preferred embodiment of the present invention. In the figure, the upper and lower focus ring portions 20/21 have journals 36a/36b, 37a/37b that accept pins 35. The pins may be provided in different lengths to adjust the opening defined by the upper and lower ring portions. Additionally, the rings may be profiled to provide a larger opening in the region that defines the slots 22/23, and little or no opening in the region that defines the link 24.

Figure 9:
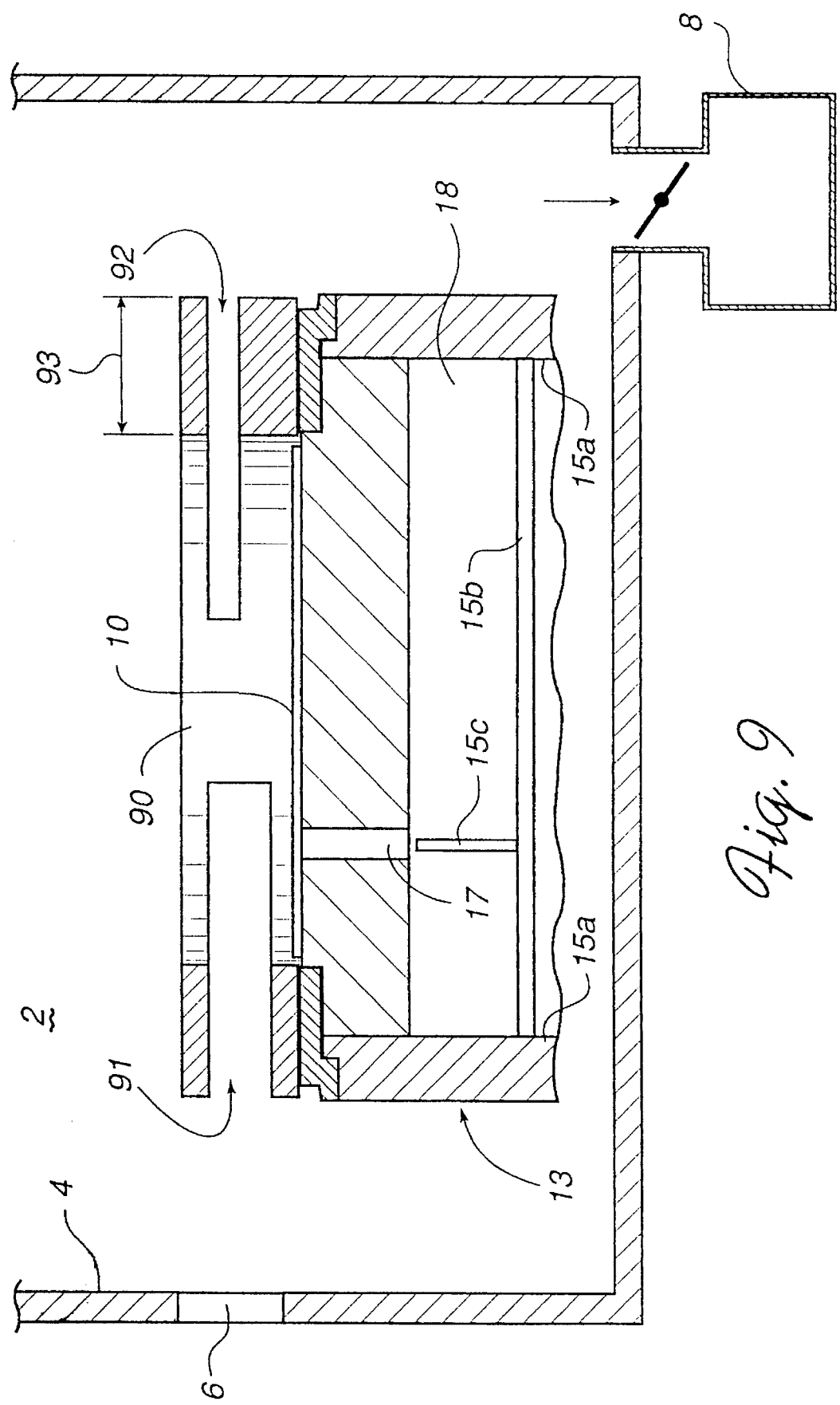
FIG. 9 is a partially sectioned schematic view of a reaction chamber, including a thick slotted stationary focus ring according to the present invention.

FIG. 9 is a partially sectioned schematic view of a reaction chamber, including a thick slotted stationary focus ring 90 according to the present invention. In the figure, the focus ring is produced in accordance with the teachings of the invention set forth above with regard to slot size and location. Thus, the focus ring includes a first slot 91 that is adapted to receive a wafer transfer blade and a wafer; and a second slot 92 that is adapted to equalize gas flow across the wafer surface and thereby optimize process uniformity. However, the focus ring in accordance with FIG. 9 is a thick ring. That is, the ring is thicker than 2 mm, as shown by the arrow identified by numeric designator 93. It is thought that a thick focus ring, by reducing the pumping volume in the chamber, serves to eliminate the need for much or all of the exhaust plenum, thereby allowing the production of a smaller chamber in which more exact process control may be obtained. Thus, by directing most or all of the plasma across the wafer surface the invention assures that more molecular collisions will occur, such that processing is more efficient and such that process uniformity is improved.

Figure 10:
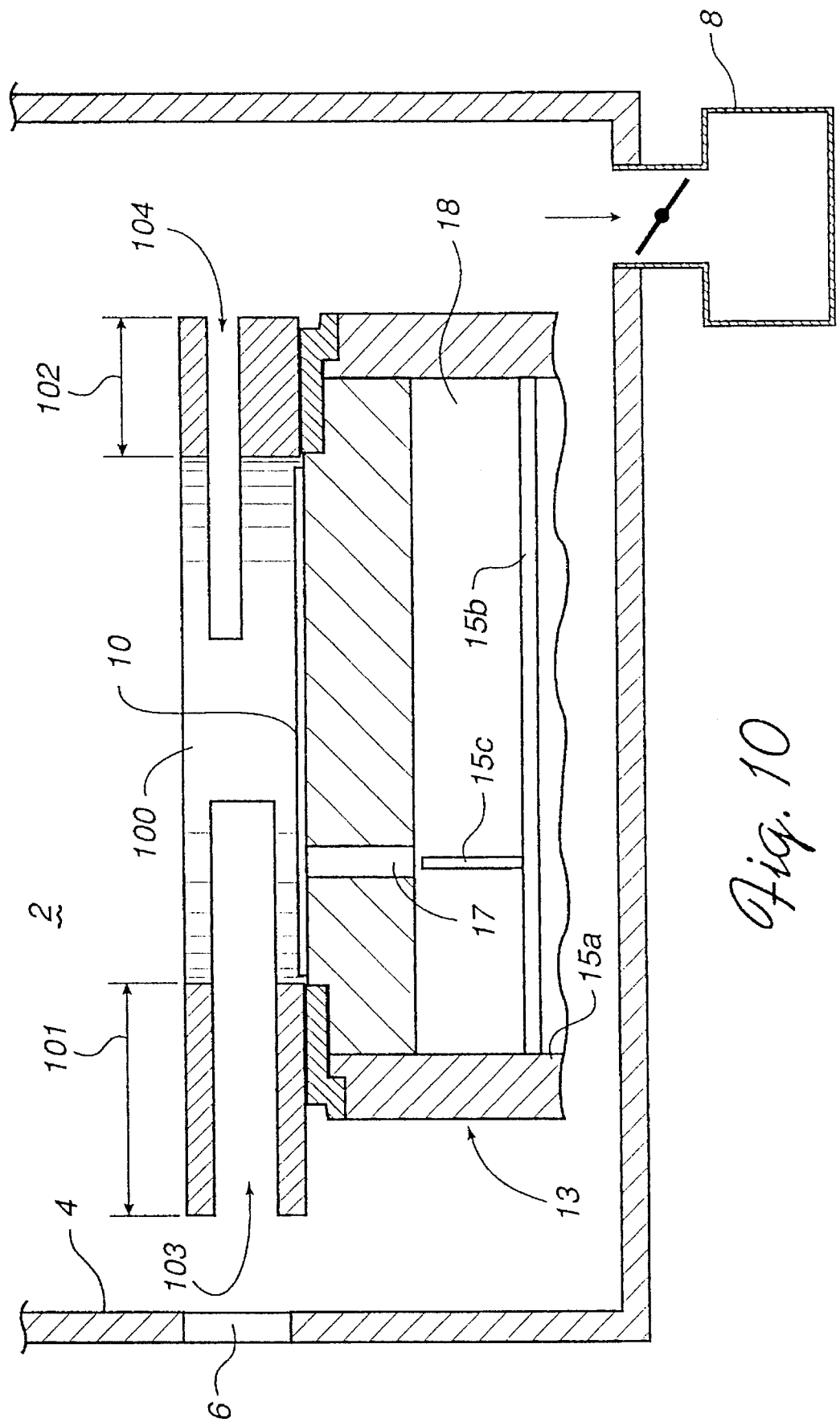
FIG. 10 is a partially sectioned schematic view of a reaction chamber, including an eccentric, thick slotted stationary focus ring according to the present invention.

FIG. 10 is a partially sectioned schematic view of a reaction chamber, including an eccentric, thick slotted stationary focus ring 100 according to the present invention. In the figure, the focus ring is slotted, and therefore provides openings 103 and 104, as with the focus rings described above. However, the edge of the focus ring nearest the vacuum pump 8 extends a lesser amount toward the chamber walls 4, as indicated by the arrow identified by numeric designator 102 than the edge of the focus ring nearest the slit valve 6, as indicated by the arrow identified by numeric designator 101.

This aspect of the invention provides a focus ring that, in accordance with the teachings above, has a minimal, yet symmetric slotted opening, such that a maximum and uniform process gas flow is maintained across the wafer surface. The eccentric shape of the focus ring enables the focus ring to act as a baffle to displace process gas away from the region of the slit valve and related focus ring slot 103, such that the disproportionate gas flow through the wafer loading/ unloading slot 103 is balanced by a higher exhaust pressure in the region of the other focus ring slot 104, which is nearest the vacuum pump 8.

Figure 11:
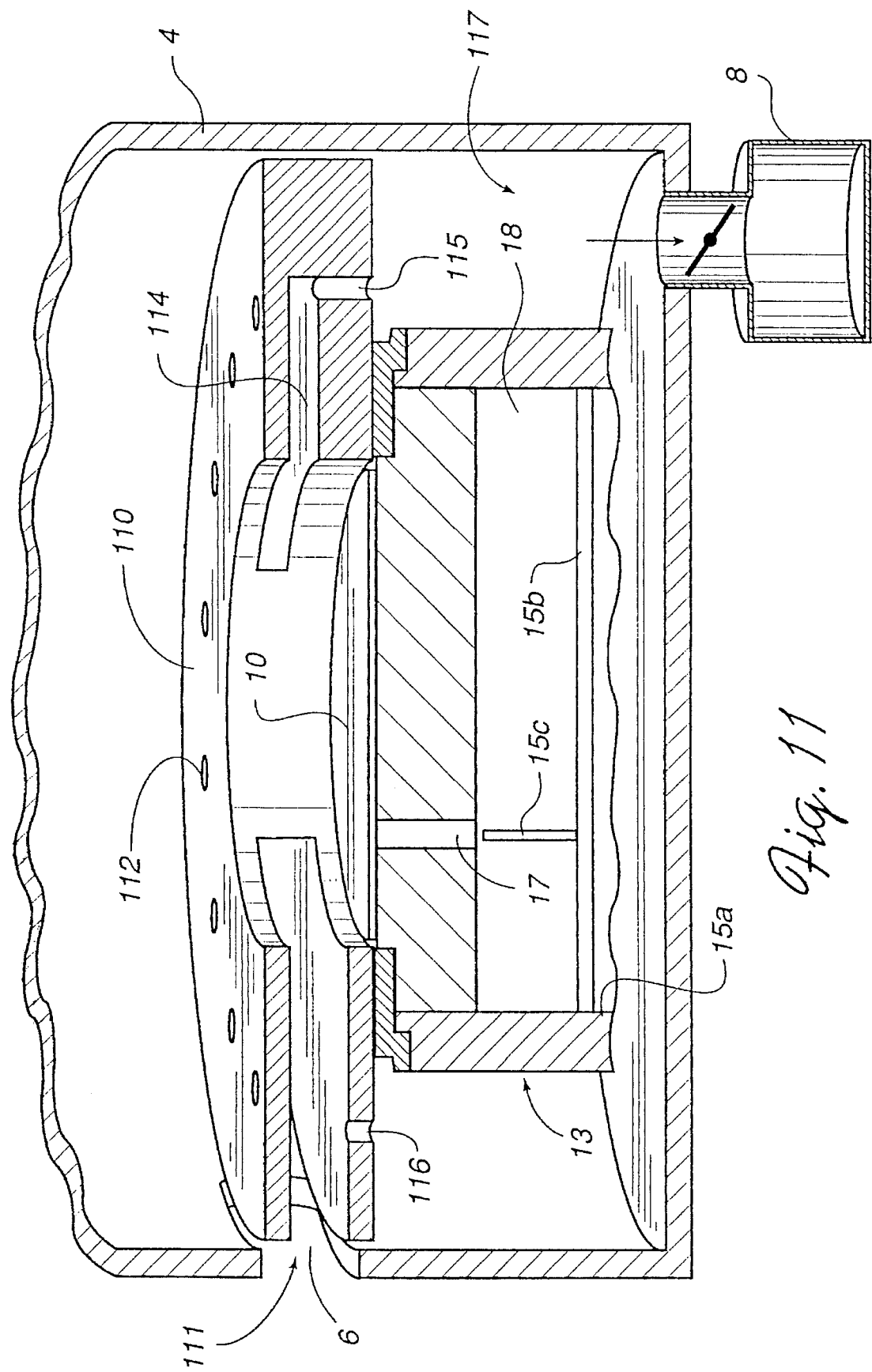
FIG. 11 is a partially sectioned, partial perspective schematic view of a reaction chamber, including an integrated slotted stationary focus ring and process gas distribution baffle according to the present invention.

FIG. 11 is a partially sectioned, partial perspective schematic view of a reaction chamber, including an integrated slotted stationary focus ring and gas distribution baffle 110 according to the present invention. In the figure, the focus ring extends to the inner surface of the chamber walls 4, thereby directing all process gas through apertures 112 that are formed transversely through the focus ring surface, and across the wafer surface, and through slots 111 and 114, and related apertures 116 and 115, respectively. Slot 111 is aligned with the slit valve 6 and configured to allow ingress and egress for the wafer transfer blade and wafer. Slot 114 is configured to allow a sufficient process gas exhaust pressure across the wafer surface such that process gases are exhausted evenly through each slot. The apertures 112 are provided as necessary about the periphery of the focus ring, such that process gases are exhausted into an exhaust plenum 117 symmetrically to maintain process specific operating pressures and process gas concentrations within the chamber, especially in the vicinity of the wafer surface. It should be appreciated that any number of slots may be provided in this embodiment of the invention, such that the apertures may be dispensed with, i.e. all process gas may be directed across the wafer surface and exhausted exclusively through slots formed in the focus ring. In such embodiment, the focus ring functions as an exhaust gas manifold. Thus, this embodiment of the invention provides a slotted focus ring that also serves as a reaction chamber baffle, thereby providing reduced chamber volume and better control of process gas concentrations across the wafer surface.

Thus, a stationary focus ring is shown that provides uniform gas flow across the wafer surface, while directing a maximum amount of process gas to all areas of the wafer to assure uniform process at an optimal rate. Although the invention is described herein with reference to the preferred embodiment, one skilled in the art will readily appreciate that other applications may be substituted for those set forth herein without departing from the spirit and scope of the present invention. Accordingly, the invention should only be limited by the claims included below.

I claim:

1. A focus ring for a plasma reactor for processing a semiconductor wafer, said focus ring surrounding the periphery of the wafer, said focus ring comprising:

an upper ring portion;

a lower ring portion; and at least one link joining said upper and lower ring portions such that said upper and lower ring portions and said link define a first slotted opening adapted to receive a wafer transfer blade and a wafer and a second slotted opening; said first and second slotted openings being adapted to cooperate to exhaust process gas across the wafer surface, such that gas flow distribution across the wafer surface is balanced, while contaminating particles are swept from the wafer edges.

2. The focus ring of claim 1, wherein said first slotted opening is aligned with a reactor slit valve, such that said focus ring remains stationary during wafer loading, unloading, and processing.

3. The focus ring of claim 1, wherein said focus ring is a unitary structure.

4. The focus ring of claim 1, wherein said focus ring is a compound structure comprising:

an upper focus ring portion;

a lower focus ring portion; and a link adapted to join said first and said second ring portions.

5. The focus ring of claim 4, wherein said link further comprises:

a tab that projects vertically from one ring portion; and a slot formed within the other ring portion that is adapted to receive said tab.

6. The focus ring of claim 4, wherein said link further comprises:

aligned journals formed within each of said first and second ring portions; and a pin adapted to be set within said aligned journals to join said first and said second ring portions.

7. The focus ring of claim 4, wherein said first ring portion comprises an upper ring portion, and wherein said upper ring portion defines at least one selected focus ring configuration.

8. The focus ring f claim 7, wherein said upper ring portion further comprises a plurality of interchangeable upper rings that define a plurality of selected focus ring configurations.

9. The focus ring of claim 4, wherein said first ring portion and said second ring portion are made of different materials.

10. The focus ring of claim 9, wherein said first ring portion comprises an upper ring portion made from a material selected from the group including, ceramics, and quartz; and wherein said second ring portion comprises a lower ring portion made from a process insensitive material.

11. The focus ring of claim 1, wherein said first and said second slotted openings are not the same size.

12. The focus ring of claim 1, wherein said first and second slotted openings have a lower opening edge that is formed above the wafer surface to define a process gas barrier.

13. The focus ring of claim 1, wherein said focus ring has a ring thickness that is greater than 2 mm.

14. The focus ring of claim 14, wherein said focus ring has a ring thickness sufficient to extend an outer ring surface up to a reactor inner wall surface.

15. The focus ring of claim 14, wherein said focus ring has apertures formed therethrough and in communication with an exhaust plenum.

16. The focus ring of claim 13, wherein said focus ring has an eccentric outer ring surface.

17. A stationary, compound focus ring for a plasma reactor for processing a semiconductor wafer, said focus ring surrounding the periphery of the wafer, said focus ring comprising:

an upper ring portion;

a lower ring portion; and at least one link joining said upper and lower ring portions such that said upper and lower ring portions and said link define a first slotted opening aligned with a reactor slit valve and adapted to receive a wafer transfer blade and a wafer, and a second slotted opening adapted to exhaust process gas across the wafer surface, wherein said first and second slotted openings have a lower opening edge that is formed above the wafer surface to define a process gas barrier;

whereby uniform gas flow distribution is maintained across the wafer surface.

18. The focus ring of claim 17, wherein said focus ring has a ring thickness that is greater than 2 mm.

19. In a plasma reactor for processing a semiconductor wafer, a process for maintaining uniform gas flow distribution across the wafer surface, comprising the steps of:

receiving a wafer transfer blade and a wafer through a first slotted opening formed in a fixed focus ring that is aligned with a reactor slit valve; and exhausting process gas across the wafer surface through a second slotted opening formed in said focus ring;

wherein said first and said second slotted focus ring openings cooperate to provide uniform process gas flow distribution across the wafer surface.

* * * * *